United States Patent [19]

Kida et al.

[11] Patent Number: 5,069,741
[45] Date of Patent: Dec. 3, 1991

[54] METHOD OF MANUFACTURING QUARTZ DOUBLE CRUCIBLE ASSEMBLY

[75] Inventors: Michio Kida, Urawa; Kensho Sahira, Yono, both of Japan

[73] Assignee: Mitsubishi Kinzoku Kabushiki Kaisha, Tokyo, Japan

[21] Appl. No.: 413,213

[22] Filed: Sep. 27, 1989

Related U.S. Application Data

[63] Continuation-in-part of Ser. No. 170,356, Mar. 18, 1988, abandoned.

[30] Foreign Application Priority Data

Mar. 20, 1987 [JP] Japan .................................. 62-67128

[51] Int. Cl.⁵ ............................................. C30B 15/52
[52] U.S. Cl. .............................. 156/617.1; 156/619.1; 156/620.4; 156/DIG. 64; 156/DIG.83; 422/249
[58] Field of Search ............... 156/617.1, 619.1, 620.4, 156/DIG. 64, DIG. 83, 86; 422/245, 249; 373/18, 122

[56] References Cited

U.S. PATENT DOCUMENTS

| H,520 | 9/1988 | Johnson et al. ................. 156/617.1 |
| 3,015,592 | 1/1962 | Leopold ............................. 422/249 |
| 3,240,568 | 9/1966 | Derby et al. ............... 156/DIG. 83 |
| 4,036,595 | 7/1977 | Lorenfini et al. ................ 156/617.1 |
| 4,207,293 | 6/1980 | Scholl et al. ..................... 156/617.1 |
| 4,235,848 | 11/1980 | Sokolov et al. ................. 156/617.1 |
| 4,352,784 | 10/1982 | Lin .............................. 156/DIG. 83 |

FOREIGN PATENT DOCUMENTS

| 1194820 | 7/1965 | Fed. Rep. of Germany ... 156/617.1 |
| 2245250 | 3/1974 | Fed. Rep. of Germany ... 156/617.1 |
| 61-281100 | 12/1986 | Japan ................................ 156/620.4 |
| 2180469 | 4/1987 | United Kingdom ................ 422/249 |

Primary Examiner—Robert Kunemund
Attorney, Agent, or Firm—Cushman, Darby & Cushman

[57] ABSTRACT

A quartz double crucible assembly utilized for producing silicon crystalline rods is manufactured as follows. First, outer and inner quartz crucibles are prepared by means of arc fusion method. Then, the outer and inner crucibles are received in a vessel accommodated in a heat-treating furnace. Subsequently, the crucibles are heated to a prescribed elevated temperature. Thus, the outer and inner crucibles are caused to join together, and a double crucible assembly is produced.

7 Claims, 5 Drawing Sheets

METHOD OF MANUFACTURING QUARTZ DOUBLE CRUCIBLE ASSEMBLY

CROSS-REFERENCE TO RELATED APPLICATION

This is a continuation-in-part of application Ser. No. 07/170,356 filed Mar. 18, 1988, now abandoned.

BACKGROUND OF THE INVENTION

1. Field of the Invention

The present invention relates to a method of manufacturing a quartz double crucible assembly which is utilized for producing silicon crystalline rods.

2. Prior Art

Extensively used for manufacturing silicon monocrystal rods is a Czochralski method which comprises the step of pulling a silicon monocrystal rod from a melt in a crucible while continuously adding a silicon material to the melt in order to maintain the quantity of the melt constant.

FIG. 1 shows an example of a double crucible utilized in such method which includes an outer crucible 100 and a cylindrical inner crucible member 102 housed within the outer crucible 100 so as to be coaxial therewith. The inner crucible member 102 includes a pair of cut-outs 104 and 104 formed at a lower end thereof, and a pipe 106 for feeding a silicon material is disposed with its one end directed toward a space defined between the inner crucible member 102 and the outer crucible 100, whereby the silicon material can be continuously introduced into the space. Thus, by virtue of the provision of the inner crucible member 102, the disturbance produced in the surface of the melt when the silicon material drops into the melt is prevented from being transmitted to a growing portion of a silicon crystalline rod 108, so that the disorder in its crystal structure is positively prevented.

Heretofore, a double crucible as described above has been manufactured by welding the inner crucible member 102 to the outer crucible 100 by hand by using an oxyhydrogen flame burner or the like. However, much time and labor have been required in the welding work, and therefore the manufacturing cost has been increased unduly. Particularly, the problem of increased cost has become more serious with the recent tendency of the diameter of the crucible increasing in size.

SUMMARY OF THE INVENTION

It is therefore an object of the present invention to provide a method by which a quartz double crucible assembly can be easily manufactured at a substantially reduced cost.

Another object of the present invention is to provide a method of producing a silicon crystalline rod which can be conducted continuously while leaving the double crucible assembly manufactured by the above method as it is.

According to a first aspect of the present invention, there is provided a method of manufacturing a quartz double crucible assembly which comprises the steps of producing inner and outer quartz crucibles by means of an arc fusion method, receiving these crucibles in a vessel in a prescribed arrangement, and heating them in a heat-treating furnace to thereby join the crucibles together.

According to a second aspect of the present invention, there is provided a method of manufacturing a silicon crystalline rod by using a quartz double crucible assembly produced by the application of the above method. In this case, a Czochralski furnace is used as the heat-treating furnace, and the above procedures are repeated to provide the double crucible assembly. Then, a usual silicon crystal pulling operation is conducted continuously while leaving the double crucible assembly as it is. The temperature attained by the Czochralski furnace should be at a sufficiently high level at an early stage so that the inner and outer crucibles are successfully caused to join together, but may be lowered to a usual pulling temperature after the completion of the double crucible assembly in order to ensure an effective pulling operation a well as a sufficient quality of the pulled monocrystal rods.

DESCRIPTION OF PREFERRED EMBODIMENTS OF THE INVENTION

Figure 1:
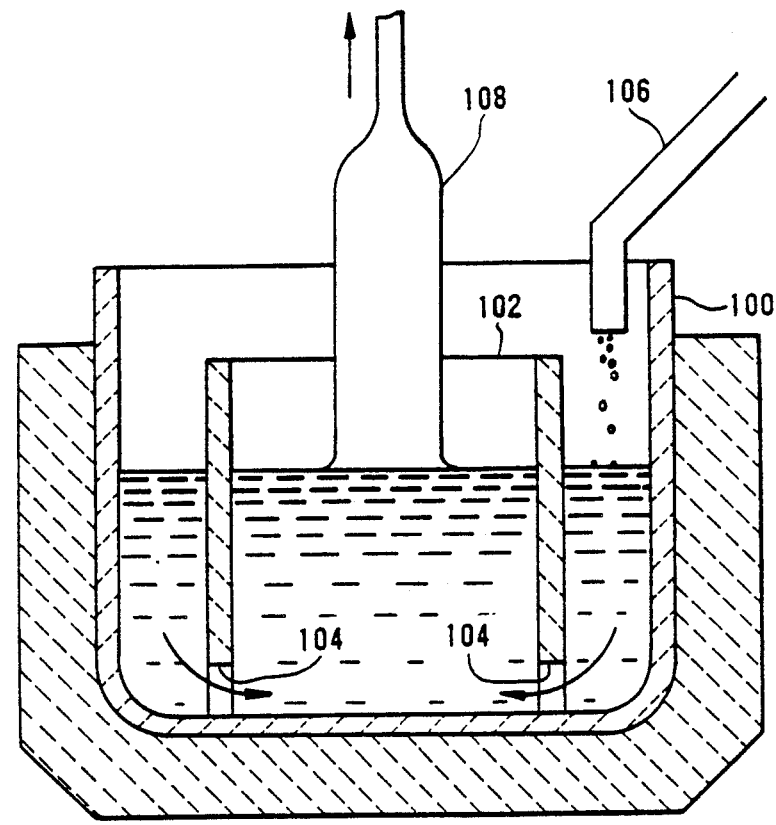
FIG. 1 is a schematic cross-sectional view showing a conventional double crucible used in the manufacture of silicon crystalline rods.
Figure 2:
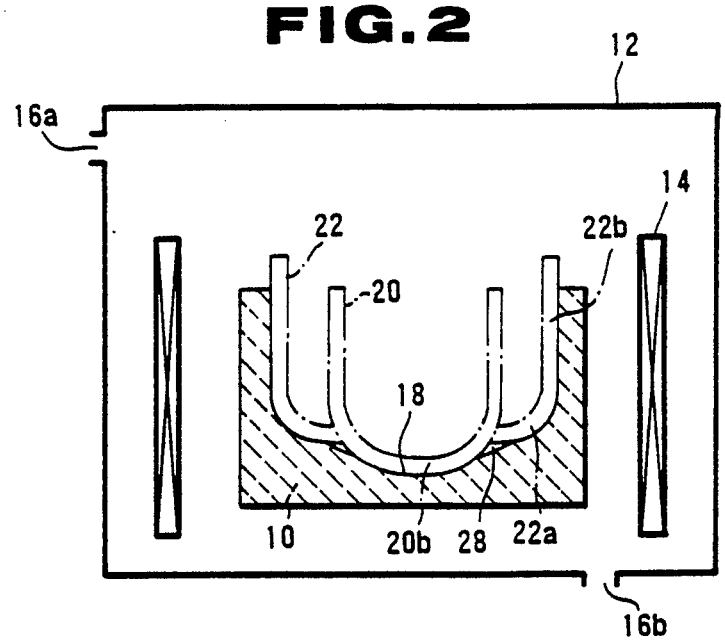
FIG. 2 is a schematic cross-sectional view showing an apparatus utilized to manufacture a double crucible assembly according to the present invention.
Figure 3:
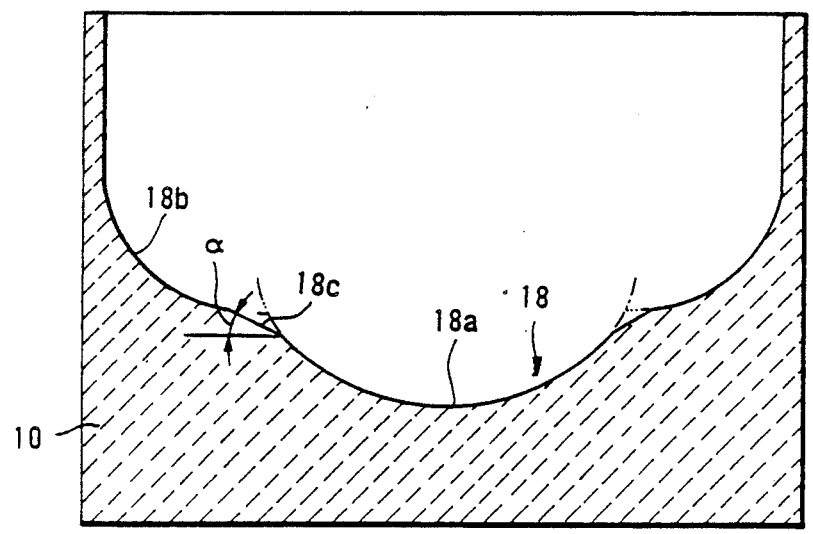
FIG. 3 is a schematic cross-sectional view of a vessel of the apparatus of FIG. 2.

FIG. 2 depicts an apparatus utilized to manufacture a double crucible assembly in accordance with the present invention. The apparatus comprises a vessel 10 made of graphite and a heat-treating furnace 12 having heating means such as a resistance heater 14. The furnace 12 is provided with an inlet 16a and an outlet 16b for inert gas such as argon gas, so that a non-oxidizing atmosphere can be maintained within thte furnace. The graphite vessel 10, which is housed in the furnace 12, has an inner surface 18 of such a shape as to be substantially complementary to an outer surface of a double crucible to be manufactured. As best shown in FIG. 3, the inner surface 18 is formed so as to be defined by a round central bottom portion 18a, a peripheral surface portion 18b serving as the inner surface wall and a part of the bottom, and an annular portion 18c joining the central portion 18a and the peripheral portion 18b together. The annular portion 18c is formed such that it slopes radially inwardly and downwardly thereof at an inclination angle $\alpha$ of about 30° C.

Figure 4:
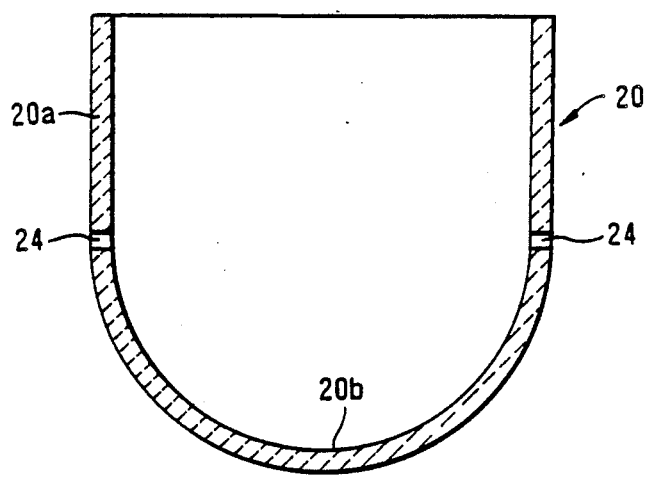
FIG. 4 is a schematic cross-sectional view of an inner crucible.
Figure 5:
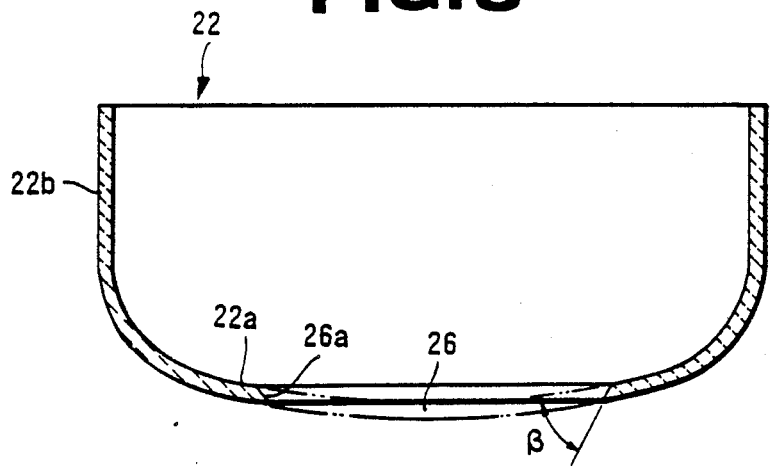
FIG. 5 is a schematic cross-sectional view of an outer crucible.

In accordance with the procedures of the present invention, inner and outer quartz crucibles 20 and 22 are first manufactured by a known arc fusion method, which comprises the steps of introducing quartz powder into a rotating mold, forming a powder layer on the inner surface of the rotating mold by the use of a former, applying heat to the layer to fuse the quartz material to form a crucible while rotating the mold, and removing the crucible from the mold. As shown in FIG. 4, the inner quartz crucible 20 is defined by a vertical wall 20a of a cylindrical shape and a bottom 20b of a generally semispherical shape. The bottom may be formed flat, but that portion which is adjacent to the vertical wall should be formed into a convexly curved shape. Furthermore, a pair of diametrically opposed apertures 24 are formed through the lower portion of the vertical wall 20a. The outer quartz crucible 22 is larger in diameter than the inner crucible 20, and is defined by a bottom portion 22a. The bottom portion 22a is provided with a circular through opening 26 of such a size as to be smaller in diameter than the vertical wall 20a of the inner crucible 20. The through opening 26 is formed after having produced an outer crucible blank by the arc fusion method, and the periphery 26a of the opening 26 is shaped so as to slope radially inwardly and downwardly thereof at an inclination angle β of about 45°. This angle may be modified, but should preferably be within the range of from about 45°.

Thereafter, the outer crucible 22 is received in the vessel 10 with the peripheral wall 22b and the bottom portion 22a substantially mated with the peripheral surface portion 18b of the inner surface 18, and the inner crucible 20 is received in the outer crucible 22 with the bottom 20b resting on the central portion 18a of the inner surface 18 of the vessel 10, in such a manner that the through opening 26 of the outer crucible 22 is obturated by the bottom 20b of the inner crucible 20 and that the periphery 26a of the opening 26 is located under the outer end portion of the semispherical bottom 20b of the inner crucible 20. In the illustrated embodiment, by virtue of the provision of the inclined annular portion 18c on the inner surface 18 of the vessel 10, an annular gap 28 of a small volume is formed between the inner surface of the vessel 10 and those portions of the inner and outer crucibles 20 and 22 to be joined together.

Subsequently, the heater 14 in the heat-treating furnace 12 is operated to heat the inner and outer crucibles 20 and 22 to a temperature of between about 1,350° C. and about 1,650° C. As a result, those portions of the inner and outer crucibles 20 and 22 disposed above the gap 28 get soft and are deformed downwardly by virtue of their own weight, so that the gap is plugged. Thus, the adjacent portions of the crucibles 20 and 22 adhere to each other, and a double quartz crucible assembly is manufactured. The temperature to which the crucibles 20 and 22 are heated may be varied, but should be within the above range, preferably within the range of between about 1,500° C. and about 1,600° C. If the temperature is below the lower limit, then the crucibles 20 and 22 cannot get softened to a sufficient degree, and therefore cannot be joined successfully. On the other hand, if the temperature exceeds the above limit, the crucibles 20 and 22 are subjected to an excessive softening, resulting in an adversely deformed double crucible assembly.

In the foregoing, the volume and shape of the annular gap 28 formed between the vessel 10 and the crucibles 20 and 22 should be determined in such a manner that when softened by heating, the crucibles are deformed to plug the gap 28 entirely, thereby permitting all the outer surface of the double crucible assembly thus formed to be brought into contact with the inner surface 18 of the vessel 10. Such a gap 28 is formed so that the maximum value is preferably within the range of between 3 mm and 10 mm in transverse cross-section.

In addition, in order that the gap 28 is plugged with the quartz material of the crucibles, the gas contained in the gap 28 has to be released therefrom. For effecting such releasing, a vent may be mounted on the vessel 10. However, inasmuch as the vessel 10 is conventionally comprised of several parts joined together, the gas can be usually released through a slit or gap between the parts. In addition, the gas may pass between the vessel 10 and the outer crucible 22 since the contact surfaces thereof have some roughness.

Furthermore, in the above embodiment, a Czochralski furnace could as well be utilized as the heat-treating furnace 12. In such a case, the pulling of silicon monocrystal rods can be effected in succession while leaving a double crucible assembly manufactured as it is.

Figure 6:
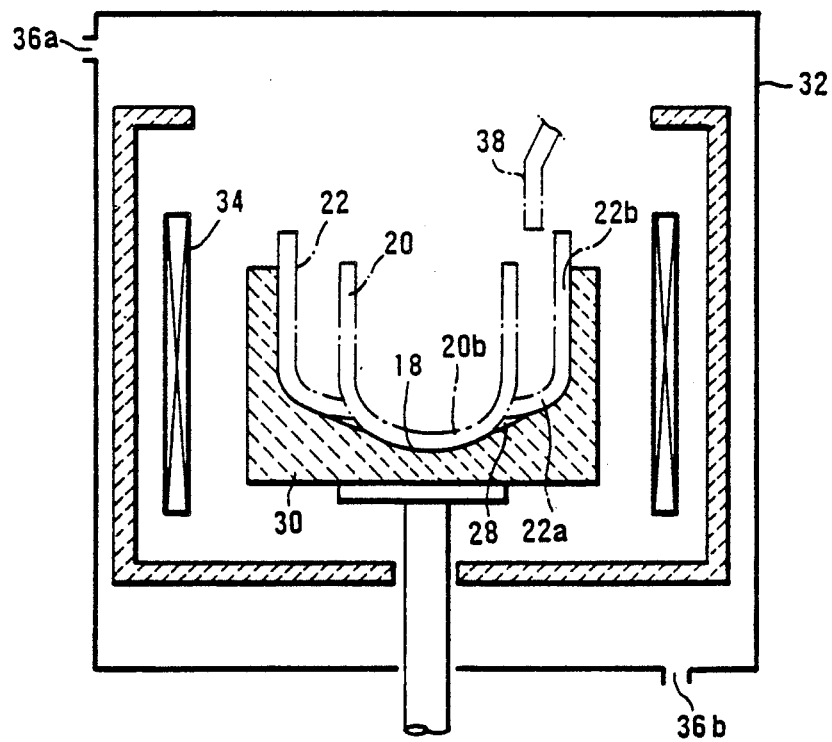
FIG. 6 is a schematic cross-sectional view showing a crystal pulling apparatus utilized to manufacture a double crucible assembly and to pull silicon monocrystal rods according to the present invention.

FIG. 6 depicts the apparatus for pulling silicon monocrystal rods from a melt. The apparatus comprises a graphite susceptor 30, which is basically similar in construction to the above-mentioned vessel 10, housed in a Czochralski furnace 32 which includes a resistance heater 34 disposed so as to surround the susceptor 30 and an inlet 36a and an outlet 36b for introducing and discharging inert gas such as argon gas. The double crucible assembly can be produced in the same way as described above, and after the double crucible assembly is manufactured, the pulling operation of silicon monocrystal rods is conducted in succession. More specifically, as is the case with a conventional process, a silicon polycrystal material is introduced in the inner crucible 20 and melted, following which a seed crystal is immersed in the melt. Thereafter, the seed crystal is pulled by a usual pulling means from the melt while silicon polycrystal granules ar supplied through a feed pipe 38 into a space between the walls of the crucibles 20 and 22, i.e., in the outer crucible 22, and thus a silicon monocrystal rod is produced.

Figure 7:
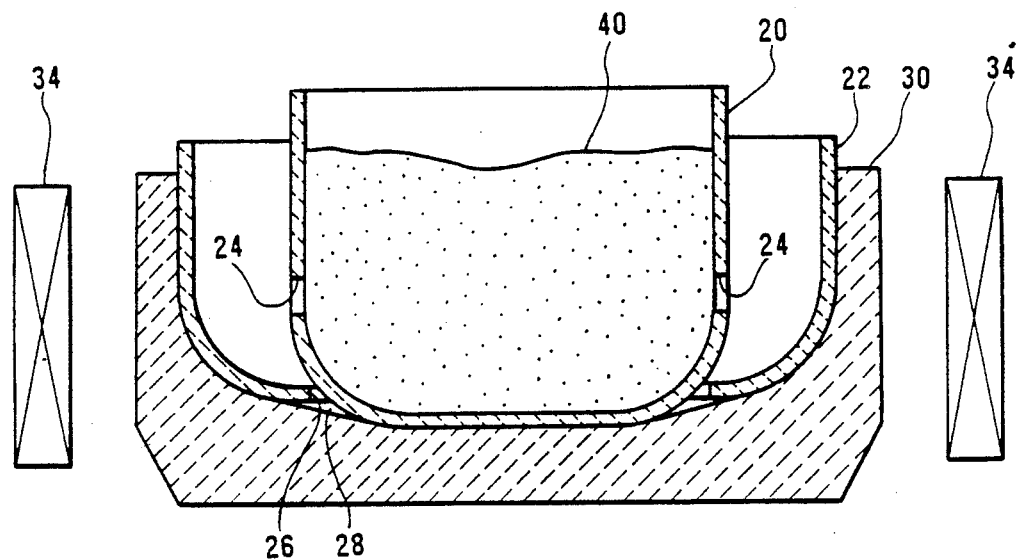
FIGS. 7 and 8 are schematic cross-sectional views showing a modified method of manufacturing a double crucible assembly.
Figure 8:
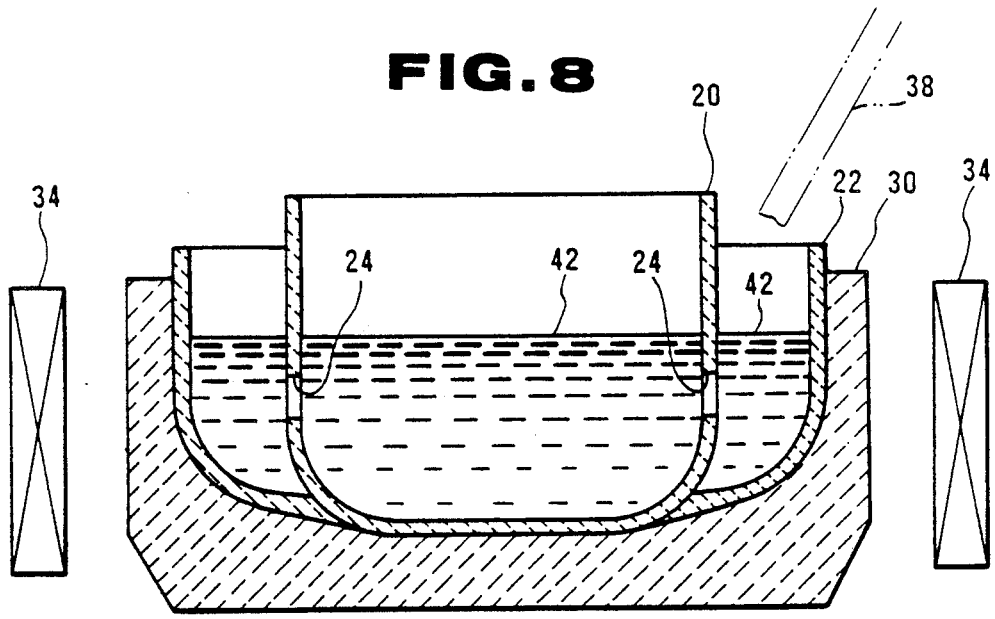

In the foregoing, the inner crucible 20 may be charged with a silicon polycrystal material 40 after having placed the inner and outer crucibles 20 and 22 in the susceptor 30 as shown in FIGS. 7 and 8. Such material should be in the form of lumps which preferably are at a size greater than the diameter of the apertures 24. The silicon polycrystal material 40 contained in the inner crucible 20 becomes molten when heated, and ultimately some flows through the apertures into the outer crucible 22, as at 42. However, before the silicon melt begins t flow into the outer crucible 22, the manufacture of the double crucible assembly is completed. The amount of the silicon polycrystal material 40 to be added is determined such that when the silicon polycrystal material 40 melts, the surface of the silicon material thus melted does not reach the apertures 24 until about 50 percent by volume of the silicon polycrystal material 40 melts. Such a charging of the polycrystal material facilitates the joining of the crucibles 20 and 22 since its weight is exerted on the inner crucible 20.

The temperature range to which the crucibles must be heated may be within the same range as in the previous embodiment. However, in this embodiment, although the temperature should be maintained at a sufficiently high level at an early stage so that the inner and outer crucibles 20 and 22 are successfully caused to join together, it may be lowered to a usual pulling temperature after the completion of the double crucible assembly in order to ensure an effective pulling operation as well as a sufficient quality of pulled monocrystal rods.

Figure 9:
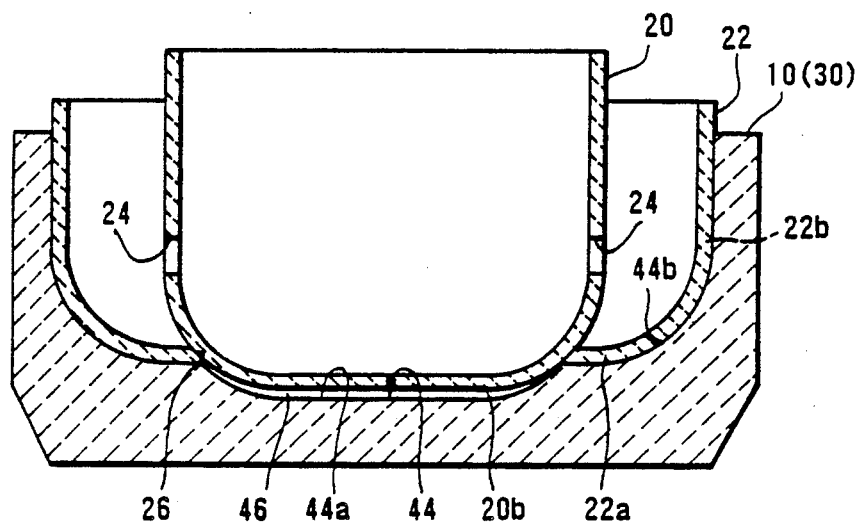
FIG. 9 is a schematic cross-sectional view showing another modified method of manufacturing a double crucible assembly.

Furthermore, the inner and outer crucibles 20 and 22 and the vessel 10 or the susceptor 30 may be formed so that they are arranged in a manner as shown in FIG. 9. In this embodiment, the vessel or susceptor is formed so as to have an inner surface 44 defined by a round central bottom portion 44a and a peripheral surface portion 44b disposed around the central portion, the peripheral surface portion serving as the inner surface wall and a part of the bottom. The outer crucible is formed so that it is received in the vessel or the susceptor with its peripheral wall 22b and its bottom portion 22a mated with the peripheral surface portion 44b of the inner surface 44, while the inner crucible is formed so that it is received in the outer crucible 22 with an outer portion of its bottom 20b held in contact with the periphery of the opening 26 of the outer crucible, in such a manner that a gap 46 is formed between the inner surface 44 and the bottom 20b. Such a gap 46 is determined such that its maximum value preferably ranges from 2 mm to 10 mm.

As described above, the method in accordance with the present invention comprises only the steps of receiving the appropriate outer and inner crucibles in the susceptor and heating them to an appropriate temperature. Therefore, although in the prior art method, the welding of the inner crucible member to the outer crucible requires much time and labor, such welding work is not required at all in the method of the present invention. In addition, inasmuch as quartz crucibles of the type hitherto used can be utilized as the outer and inner crucibles, it is not necessary to prepare any crucible blanks of an intricate shape. Therefore, the productivity of double crucible assemblies can be highly enhanced, and its manufacturing cost can be reduced substantially.

Furthermore, as described above, the joining of the outer and inner crucibles can be conducted effectively and completely by filling the inner crucible with silicon material prior to the heating step. What is more, the manufacture of the crystalline rods can be commenced while leaving the double crucible assembly manufactured as it is.

The present invention will now be described in more detail by way of the following examples.

EXAMPLE 1

There were prepared two quartz crucibles of 305 mm and 255 mm in diameter, respectively, and then a circular opening and apertures as described above were formed in the crucibles. Thereafter, the crucibles were received in the susceptor in such a manner as to define an annular gap therebetween, and the inner crucible was filled with 12 Kg of lump silicon material. Subsequently, the air in the Czochralski furnace was displaced by argon gas, and electric power was applied to the resistance heater to heat the crucibles to about 1,600° C. As a result, the silicon material contained in the inner crucible became molten and some flowed from the inner crucible through the apertures into the outer crucible. Before the molten silicon material began to flow into the outer crucible, that portion of the inner crucible disposed above the gap was deformed so as to plug the gap and adhere to the outer crucible, and those portions of the crucibles joined together were held in contact with the inner surface of the susceptor. Thus, the melt flowing through the apertures into the outer crucible was successfully held in the outer crucible without any leakage.

Furthermore, a usual pulling operation was conducted in succession while leaving the double crucible assembly thus manufactured as it was, and a monocrystal rod of 102 mm in diameter having no defects in its crystal structure was easily produced.

EXAMPLE 2

An outer crucible of 255 mm in diameter and an inner crucible of 176 mm in diameter were prepared by a known arc fusion method, and were placed in a susceptor in a manner as mentioned above. The gap between the inner crucible and the susceptor was 4 mm. Then, the inner and outer crucibles were heated by the heater, and it was observed how many hours were required to complete the joining of the inner and outer crucibles. The results are set forth in Table 1.

TABLE 1

| Temperature (°C.) | 1300 | 1350 | 1400 | 1450 | 1500 | 1550 | 1600 | 1650 | 1700 |
|---|---|---|---|---|---|---|---|---|---|
| Time (Hr) | * | 30 | 15 | 5 | 1.5 | 1 | 0.5 | 0.2 | # |

*The crucibles did not join each other even after 48 hours lapsed.
The crucibles were deformed unduly, so that a proper double crucible could not be obtained.

As will be seen from Table 1, the temperature range of between 1,500° C. and 1,600° C. is the most preferable.

What is claimed is:

1. A method of manufacturing a silicon crystalline rod, comprising the steps of:
   (a) providing a Czochralski furnace and a graphite susceptor housed in said furnace;
   (b) producing an inner quartz crucible by means of arc fusion method, said inner crucible being defined by a vertical wall of a cylindrical shape and a bottom having a convexly curved portion adjacent to said vertical wall, said inner crucible being provided with at least one aperture formed therethrough;
   (c) producing an outer quartz crucible larger in diameter than said inner crucible by means of arc fusion method, said outer crucible being defined by a bottom portion and a peripheral wall extending from said bottom portion, said bottom portion being provided with a through opening of such a size as to be smaller in diameter than said vertical wall of said inner crucible;
   (d) receiving said outer crucible in said susceptor with said peripheral wall and said bottom portion substantially mated with the inner surface of said susceptor and receiving said inner crucible in said outer crucible in such a manner that said through opening of said outer crucible is obturated by said bottom of said inner crucible and that a periphery of said opening is located under said convexly curved portion of said bottom of said inner crucible, said inner crucible being free from fixed interconnection with said outer crucible;
   (e) subsequently charging said inner crucible with a silicon polycrystal material;
   (f) subsequently operating said furnace to heat said outer and inner crucibles to a temperature between 1,500° C. and 1,600° C. to thereby cause said outer and inner crucibles to be fixedly joined together to produce a double quartz crucible and to cause the silicon polycrystal material in said inner crucible to melt;

(g) subsequently immersing a seed crystal in the silicon material melt; and (h) subsequently pulling out said seed crystal from the melt while supplying a silicon material into said double crucible assembly.

2. A method according to claim 1, wherein the silicon polycrystal material is charged in such an amount that when the silicon polycrystal material melts in said heating step (f), the surface of the silicon material thus melted does not reach said aperture until about 50 percent by volume of said polycrystal silicon material melts.

3. A method according to claim 1, in which said susceptor is formed so that said inner surface is defined by a central portion on which said bottom of said inner crucible is received, a peripheral portion with which said outer crucible is held in contact, and an annular portion joining said central portion and said peripheral portion and disposed under said convexly curved portion of said inner crucible, said annular portion being formed such that in said receiving step (d), an annular gap is formed between said annular portion and those portions of said crucibles disposed adjacent to each other.

4. A method according to claim 3, in which the maximum dimension of said annular gap is 3 mm to 10 mm in transverse crosssection.

5. A method according to claim 1, in which said susceptor is formed so that said inner surface is defined by a central portion and a peripheral portion disposed around said central portion, said inner crucible being formed so that in said receiving step (d), the inner crucible is received in said outer crucible with said bottom held in contact with the periphery of said opening in such a manner that a gap is formed between said inner crucible and said central portion of said inner surface of said susceptor.

6. A method according to claim 5, in which the maximum dimension of said gap is 2 mm to 10 mm in transverse cross-section.

7. A method according to claim 1, in which in said outer crucible-producing step (c) said outer crucible is produced by preparing an outer crucible blank having a bottom by means of the arc fusion method and subsequently forming said opening through said bottom.

* * * * *